US006477687B1

United States Patent
Thomas

(12) United States Patent
(10) Patent No.: US 6,477,687 B1
(45) Date of Patent: Nov. 5, 2002

(54) METHOD OF EMBEDDING RAMS AND OTHER MACROCELLS IN THE CORE OF AN INTEGRATED CIRCUIT CHIP

(75) Inventor: John C. Thomas, Sunnyvale, CA (US)

(73) Assignee: Nvidia U.S. Investment Company, Santa Clara, CA (US)

( * ) Notice: Subject to any disclaimer, the term of this patent is extended or adjusted under 35 U.S.C. 154(b) by 0 days.

(21) Appl. No.: 09/088,430

(22) Filed: Jun. 1, 1998

(51) Int. Cl.$^7$ .............................................. G06F 17/50
(52) U.S. Cl. ................... 716/8; 716/2; 716/11
(58) Field of Search ............ 716/8, 9, 10, 11, 716/2

(56) References Cited

U.S. PATENT DOCUMENTS

| | | | | |
|---|---|---|---|---|
| 4,918,614 A | * | 4/1990 | Modarres et al. ........... | 364/490 |
| 5,475,607 A | * | 12/1995 | Apte et al. ................. | 364/489 |
| 5,510,999 A | * | 4/1996 | Lee et al. ................... | 364/491 |
| 5,548,135 A | * | 8/1996 | Avery ........................ | 257/173 |
| 5,824,570 A | * | 10/1998 | Aoki et al. ................. | 438/128 |
| 5,883,814 A | * | 3/1999 | Luk et al. ................... | 364/491 |
| 5,972,740 A | * | 10/1999 | Nakamori ................... | 438/129 |
| 5,983,376 A | * | 11/1999 | Narayanan et al. ......... | 714/726 |

OTHER PUBLICATIONS

Shiffer et al, "A 473K Gate 0.7u CMOS Gate Array," IEEE, Sep. 1992, pp. 443–446.*

* cited by examiner

Primary Examiner—Vuthe Siek
(74) Attorney, Agent, or Firm—Cooley Godward LLP

(57) ABSTRACT

Macrocells, e.g., Random Access Memory ("RAM"), are arranged in columns and disposed in a core of an integrated circuit (IC) chip. The macrocells can abut each other within the columns or can be separated from each other by standard cells which are disposed to fill gaps between the macrocells within the columns. Power/ground rails are disposed vertically along the sides of the columns. The power/ground rails run the full height of the core and couple to a power/ground ring disposed along the perimeter of the core. The power/ground rails also couple to the macrocells and the standard cells and provide power to those cells. The columns can form right angles with horizontal standard cell rows, thus enabling the standard cells to couple easily to the vertically disposed power/ground rails.

9 Claims, 3 Drawing Sheets

US 6,477,687 B1

METHOD OF EMBEDDING RAMS AND OTHER MACROCELLS IN THE CORE OF AN INTEGRATED CIRCUIT CHIP

FIELD OF THE INVENTION

This invention relates to the design of integrated circuit (IC) chips and, more particularly, to embedding Random Access Memory (RAM) and other macrocells in the core of an IC chip.

BACKGROUND OF THE INVENTION

Floorplanning is an important tool used in designing IC chips to minimize chip area or maximize circuit speed. For example, a chip designer can use a floorplan editor to provide graphical feedback about the size and placement of modules without showing internal layout details. These editors can provide shaded color displays of routing density that allows designers to re-place and "rip-up-and-reroute" congested areas of a chip. A more detailed description of floorplanning is described in Neil H. E. Weste, Kamran Eshraghian, "Principles of CMOS VLSI Design: A Systems Perspective" (1993), which is incorporated herein by reference in its entirety.

In conventional floorplans, macrocells (e.g., RAM) typically are placed in a perimeter area surrounding a core comprising rows of standard cells. Standard cells typically include a row of n-transistors and a row of p-transistors. The active regions of these transistors are separated by a distance based on IC design-rules. Additionally, standard cells usually have fixed physical heights which are selected to take into account such parameters as power dissipation, propagation delay, noise immunity, and area consumption. TO Standard cells can be coupled to a power/ground ring for powering circuitry in the standard cell. The power/ground ring includes power and ground busses which can traverse the tops and the bottoms of the standard cells. The internal areas of standard cells can be used for routing transistors for specific logic gates. A more detailed description of standard cells is described in Neil H. E. Weste, Kamran Eshraghian, "Principles of CMOS VLSI Design: A Systems Perspective" (1993).

Conventional chip floorplans pose several problems for IC designs having a large number of macrocells embedded at a single hierarchical level (i.e., flat design). Macrocells can be much larger than standard cells and therefore should be judiciously placed in the chip floorplan to preserve geometric regularity. Unfortunately, the number of macrocells that can be placed in the perimeter area surrounding the standard cell core is physically limited. This physical limitation may require the macrocells to be placed within the core in an ad hoc manner. The ad hoc placement of macrocells in the core may increase the distance of such macrocells from the power/ground ring. This increased distance may make it difficult to adequately power macrocells near the center of the core. Furthermore, the larger dimensions of the macrocells may dictate the placing and routing of the smaller standard cells in the core, thereby making it difficult for chip designers to optimize the chip floorplan. Because the floorplan/layout process described above is an interactive one, any reduction in IC design complexity is highly desirable.

Accordingly, there is a need for structured techniques for embedding RAMS and other macrocells in the core of an IC chip while providing flexibility in floorplan optimization. Such techniques would greatly simplify the design of IC chips.

SUMMARY OF THE INVENTION

The present invention is directed to embedding macrocells in the core of an IC chip. In one embodiment, macrocells are arranged in columns and disposed in a standard cell core of an IC chip. The macrocells may abut each other within the columns or may be separated from each other by standard cells which are disposed to fill gaps between the macrocells within the columns. Power/ground rails are disposed vertically along the sides of the columns. The power/ground rails run the full height of the core and couple to a power/ground ring disposed along the perimeter of the core. The power/ground rails also couple to the macrocells and the standard cells and provide power to those cells. In one embodiment, the columns form right angles with horizontal standard cell rows. The right angles enable the macrocells and the standard cells to couple easily to the vertically disposed power/ground rails.

An advantage of the present invention is that the number of macrocells to be embedded in an IC chip is not physically limited by the size of the perimeter area surrounding the core.

Another advantage of the present invention is increased flexibility in floorplan optimization because the macrocells are easily swapped from column to column.

Another advantage of the present invention is increased circuit speeds because macrocells are disposed proximate to standard cells.

Another advantage of the present invention is improved routing because macrocells may be implemented within a single metal layer, thereby enabling other metal layers to be routed freely over the macrocells.

These and other features, aspects, and advantages of the present invention will become better understood with regard to the following description, appended claims, and accompanying drawings.

DETAILED DESCRIPTION OF THE INVENTION

Figure 1:
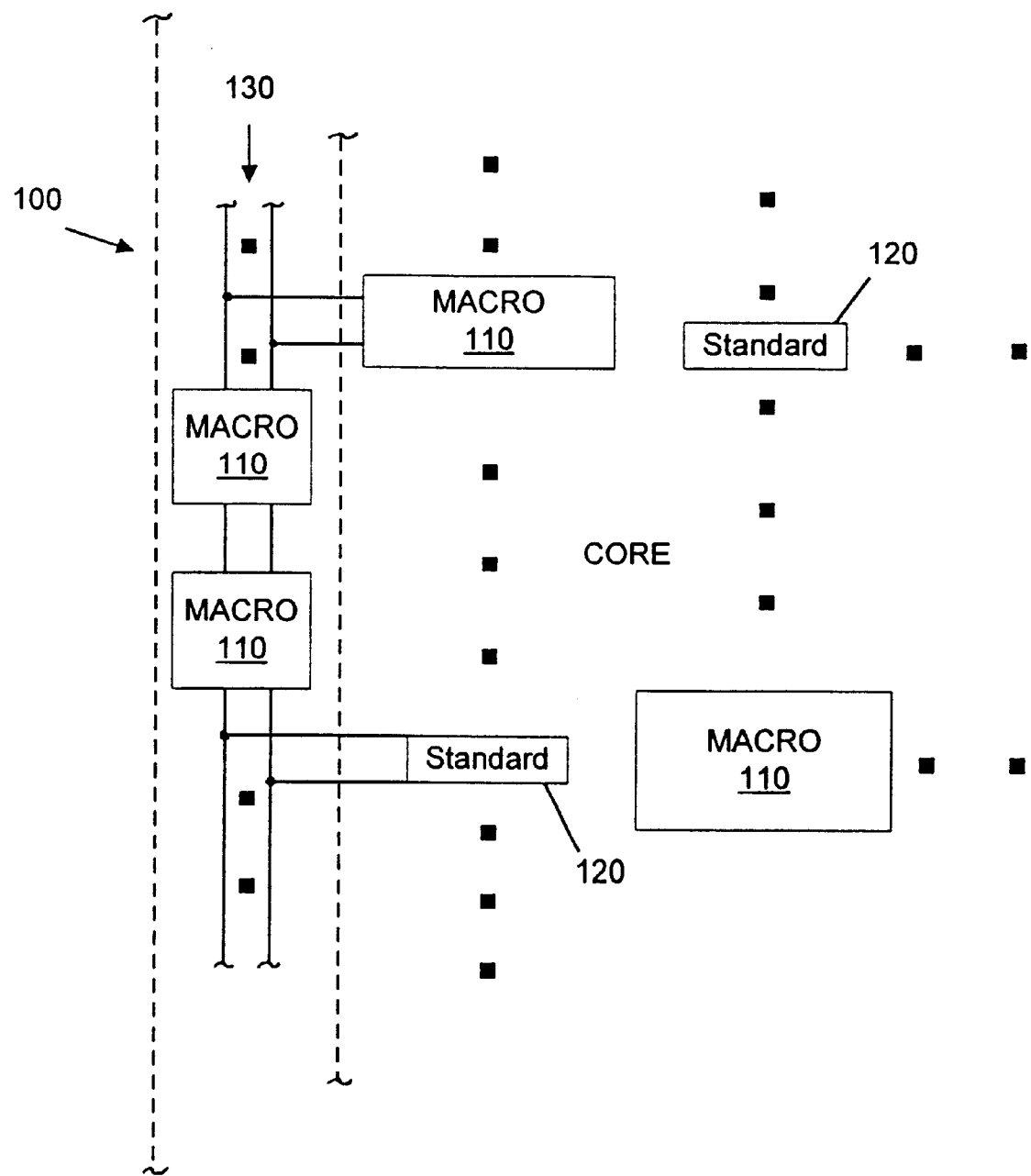
FIG. 1 is a partial layout representation of an IC chip floorplan illustrating a conventional placement of macrocells in an IC chip.

Referring to FIG. 1, there is shown a partial layout representation of an IC chip floorplan illustrating a conventional layout of macrocells 110 in an IC chip. The layout representation includes a perimeter area 100, macrocells 110, standard cells 120, and a power/ground ring 130. It is noted that this layout representation illustrates only a portion of an IC chip floorplan. Also, the term macrocell, as used herein, means any block that has been previously laid out for inclusion in an IC with other macros and standard cells. That is, where a custom block comprises a two-dimensional array of cells which have been customized for a specific or multiple functions. Other examples of macros include RAMs, Read-only Memories (ROMs), Programmable Logic Arrays (PLAs), and other types of memory arrays, multipliers (e.g., implemented as a custom array), Adders, Arithmetic Logic Units (ALUs)(e.g., implemented as a custom array), Analog-to-digital converters (ADCs), Digital-to-analog converters (DACs), Phase-lock Loops (PLLs), and other analog blocks.

The perimeter area 100 surrounds the core and includes the power/ground ring 130 for powering circuitry in the core. The power/ground ring 130 includes a power bus and a ground bus. The power bus supplies, for example, a 5V voltage to the macrocells 110 and the standard cells 120 in the core. The ground bus supplies a ground reference (e.g., zero volts) to the same.

In conventional layouts, the macrocells 110 are primarily disposed within the perimeter area 100. Each macrocell 110 can be coupled directly to the power/ground ring 130. Alternatively, the macrocells 110 can be disposed in the core in an ad hoc manner as illustrated in FIG. 1. The standard cells 120 typically are arranged in horizontal rows within the core. The placement of the standard cells 120 in the core is largely determined by the ad hoc placement of the much larger macrocells 110 in the core.

The conventional floorplan in FIG. 1 poses several problems for IC designs having a large number of macrocells 110 embedded at a single hierarchical level (i.e., flat design). For example, the number of macrocells 110 that can be placed in the perimeter area is physically limited. This physical limitation may require the macrocells 110 to be placed within the core. This placement is typically done in an ad hoc manner as shown in FIG. 1. The ad hoc placement of macrocells 110 in the core may increase the distance of such macrocells 110 from the power/ground ring 130. This increased distance may make it difficult to adequately power macrocells 110 near the center of the core. Furthermore, the larger dimensions of the macrocells 110 may dictate the placing and routing of smaller standard cells 120 in the core, thereby making it difficult for chip designers to optimize the chip floorplan.

All of these above-mentioned deficiencies in the prior art are eliminated by the present invention described in further detail below.

Figure 2:
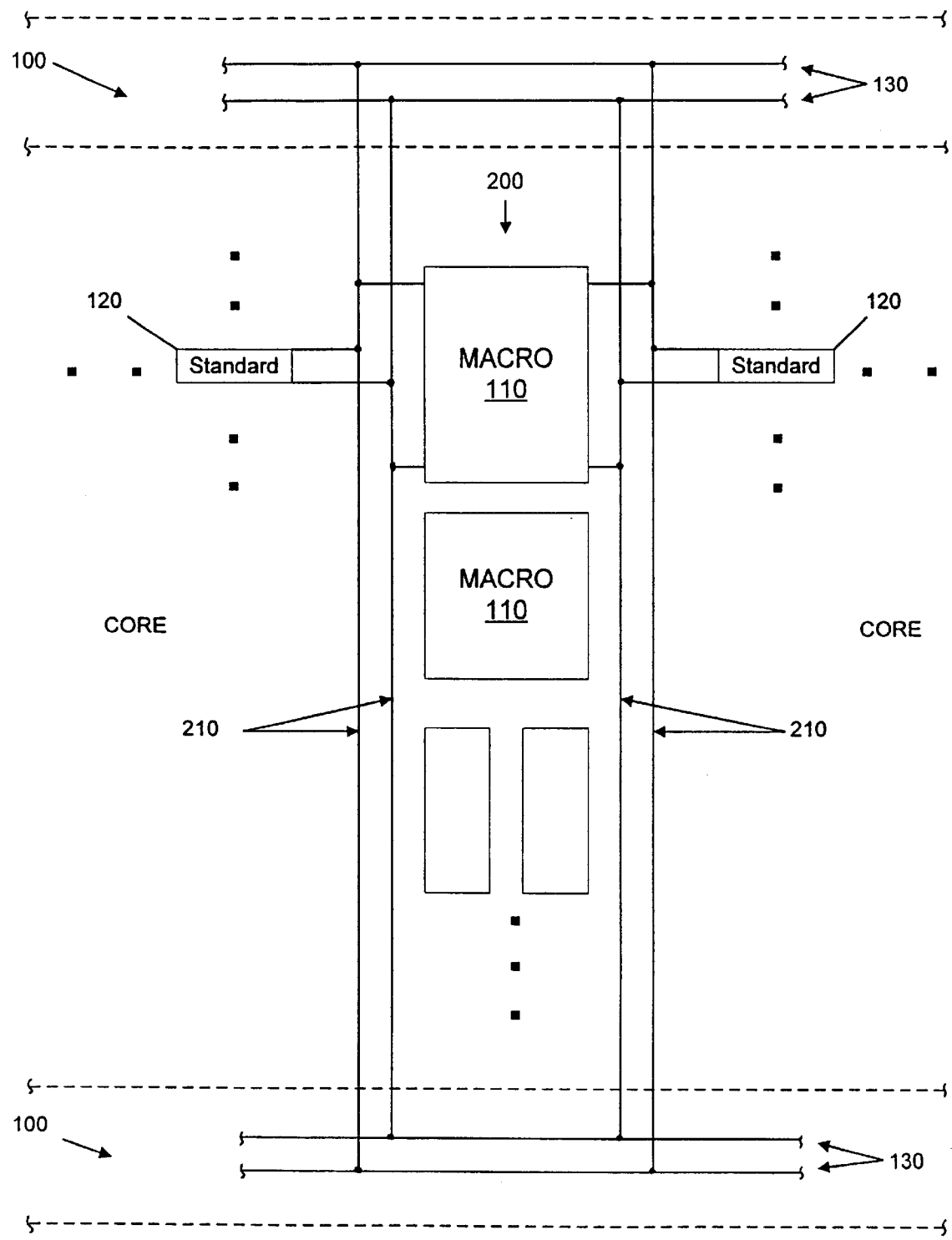
FIG. 2 is a partial layout representation of an IC chip floorplan illustrating one embodiment of a macrocell column disposed in a standard cell core of an IC chip in accordance with the present invention.

Referring to FIG. 2, there is shown a partial layout representation of an IC chip floorplan illustrating one embodiment of a column 200 disposed in a core of an IC chip in accordance with the present invention. It is noted that this layout representation illustrates only a portion of an IC chip floorplan.

The layout representation includes perimeter area 100, macrocells 110, standard cells 120, power/ground ring 130, column 200, and power/ground rails 210. In the preferred embodiment, the layout is for a single hierarchical level, i.e., flat design. The macrocells 110 are arranged in a column 200 and disposed within the standard cell core. The macrocells 110 can abut one another within the column 200 or can be separated from one another by standard cells 120 which are disposed to fill gaps between the macrocells 110 within the column 200. It is noted that the macrocells 110 can be arranged in a single metal layer using conventional techniques, thereby enabling other metal layers to be routed freely over the macrocells 110.

Power/ground rails 210 are disposed vertically along the sides of the column 200. It is noted, however, that the power/ground rails 210 need not be disposed vertically in the core, and alternative configurations are possible. In the preferred embodiment, the power/ground rails 210 are disposed vertically in the core to facilitate coupling with the macrocells 110 and the standard cells 120. The power/ground rails 210 run the full height of the core and couple to the power/ground ring 130 disposed in the perimeter area 100 surrounding the core. The power/ground rails 210 and the power/ground ring 130 each include a power bus and a ground bus. Alternatively, the power/ground rails 210 can include either a power bus or a ground bus, or a plurality of power bus and/or ground bus pairs. The power bus provides a variety of voltages to the core (e.g., 5V, 3.3V). The ground bus supplies, for example, a zero volt reference. The power bus and the ground bus, i.e., the power/ground rails 210, are coupled to top and bottom portions, respectively, of the macrocells 110. The power/ground rails 210 can also be coupled to the standard cells 120 in the core as shown in FIG. 2. This aspect of the present invention provides adequate power to the macrocells 110 and the standard cells 120 disposed near the center of the core.

The sides of the column 200 can form right angles with the standard cells 120 which typically are arranged in horizontal rows within the core. It is noted, however, that other angles are possible. In the preferred embodiment, the right angles enable the macrocells 110 and the standard cells 120 to couple easily to the vertically disposed power/ground rails 210. It is noted that while only one column 200 is shown in FIG. 2, there can be multiple columns disposed in the core of the IC chip. Also, the present invention may be implemented with one or more power/ground rails 210.

Figure 3:
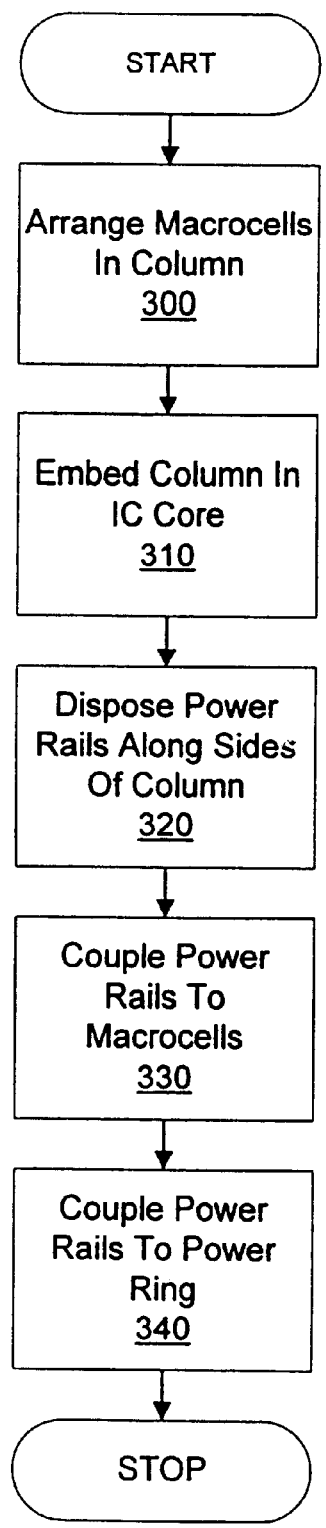
FIG. 3 is a flowchart illustrating a method of embedding RAMS and other macrocells in the core of an IC chip in accordance with the present invention.

Referring to FIG. 3, there is shown a flowchart illustrating a method of embedding RAMS and other macrocells in the core of an IC chip in accordance with the present invention. The method includes the steps of arranging 300 macrocells in columns, embedding 310 the columns in the core of an IC chip, disposing 320 power/ground rails along the sides of the columns, coupling 330 the macrocells to the respective power/ground rails, and coupling 340 the power/ground rails to a power/ground ring. Alternatively, the power/ground rails can be coupled 330 to the standard cells disposed in the core.

An advantage of the present invention set forth above is that the number of macrocells 110 to be embedded in the IC chip is not physically limited by the size of the perimeter area 100 surrounding the core. This allows for IC designs having a large number of macrocells 110. For example, some IC designs may include over one hundred macrocells 110. Because the perimeter area 100 surrounding the core cannot accommodate all of the macrocells 110, many of the macrocells 110 must be placed and routed within the core itself. The present invention enables the macrocells 110 to be placed and routed in the core in a structured manner by arranging the macrocells 110 in a column 200 and disposing the column 200 within the core. The column 200 can be treated like standard cells 120 during floorplan optimization. For example, two or more columns 200 can be easily interchanged and macrocells 110 can be easily relocated within one or more columns 200.

Another advantage of the present invention is increased circuit speed because macrocells 110 are disposed proximate to standard cells 120. The present invention enables the macrocells 110 to be disposed in the core proximate the standard cells 120. This close proximity to the standard cells 120 provides increased circuit speed. This is an improvement over conventional methods (FIG. 1) that place a majority of the macrocells 110 in the perimeter area 100 surrounding the core.

Another advantage of the present invention is the providing of power/ground rails 210 along the sides of the column 200 within the core of the IC chip, and coupling the power/ground rails 210 to the macrocells 110 and, alternatively, to both the macrocells 110 and the standard cells 120. This aspect of the present invention provides adequate power to the macrocells 110 and the standard cells 120 disposed near the center of the core.

Another advantage of the present invention is improved routing because macrocells 110 may be implemented within a single metal layer, thereby enabling other metal layers to be routed freely over the macrocells 110.

Although the present invention has been described in considerable detail with reference to certain preferred embodiments thereof, other embodiments are possible. Therefore, the spirit and scope of the appended claims should not be limited to the description of the preferred embodiments herein.

What is claimed is:

1. A method of embedding and optimizing placement of macrocells in an integrated circuit core, comprising:

defining a first column and a second column, said first column having a first conducting rail on a first side of said first column that extends vertically from a first location in a conducting ring to a second location in said conducting ring and a second conducting rail on a second side of said first column that extends vertically from a third location in said conducting ring to a fourth location in said conducting ring, said second column having a third conducting rail on a first side of said second column that extends vertically from a fifth location in said conducting ring to a sixth location in said conducting ring and a fourth conducting rail on a second side of said second column that extends vertically from a seventh location in said conducting ring to an eighth location in said conducting ring;

determining a first arrangement of macrocells and standard cells, said first arrangement having a plurality of macrocells in said defined first column and said defined second column with a first macrocell being placed in said defined first column, said first arrangement further having standard cells being placed inside or outside of a particular column and coupled to a conducting rail of said particular column;

determining a second arrangement of said plurality of macrocells in said defined first column and said defined second column, wherein said second arrangement differs from said first arrangement by placement of said first macrocell in said defined second column rather than said defined first column, wherein said first macrocell has been moved from said defined first column to said defined second column; and embedding said defined first column and said defined second column in said core.

2. The method of claim 1, wherein said conducting ring is disposed along a perimeter of said core.

3. The method of claim 1, wherein said at least one conducting rail includes a ground rail.

4. The method of claim 1, wherein said at least one conducting rail includes a power rail.

5. The method of claim 1, wherein a column forms a right angle with standard cell rows.

6. The method of claim 1, wherein said macrocells are embedded in a single hierarchical level.

7. The method of claim 1, further comprising coupling said conducting rails to macrocells.

8. The method of claim 1, further comprising coupling conducting rails to standard cells.

9. The method of claim 1, further comprising coupling conducting rails to said conducting ring.

\* \* \* \* \*